United States Patent
Au

(10) Patent No.: US 9,648,750 B2
(45) Date of Patent: May 9, 2017

(54) LIGHT EMITTING DIODE (LED) ASSEMBLY AND FLEXIBLE CIRCUIT BOARD WITH IMPROVED THERMAL CONDUCTIVITY

(71) Applicant: RSM Electron Power, Inc., Deer Park, NY (US)

(72) Inventor: Ching Au, Port Washington, NY (US)

(73) Assignee: RSM Electron Power, Inc., Deer Park, NY (US)

(*) Notice: Subject to any disclaimer, the term of this patent is extended or adjusted under 35 U.S.C. 154(b) by 295 days.

(21) Appl. No.: 14/510,299

(22) Filed: Oct. 9, 2014

(65) Prior Publication Data

US 2016/0095200 A1 Mar. 31, 2016

Related U.S. Application Data

(60) Provisional application No. 62/057,426, filed on Sep. 30, 2014.

(51) Int. Cl.
| | |
|---|---|
| *F21V 19/00* | (2006.01) |
| *H05K 1/18* | (2006.01) |
| *H05K 1/02* | (2006.01) |
| *F21V 29/74* | (2015.01) |
| *F21Y 101/00* | (2016.01) |

(Continued)

(52) U.S. Cl.
CPC ............ *H05K 1/189* (2013.01); *H05K 1/0206* (2013.01); *F21V 29/74* (2015.01); *F21Y 2101/00* (2013.01); *F21Y 2105/10* (2016.08); *F21Y 2115/10* (2016.08); *H05K 2201/066* (2013.01); *H05K 2201/10106* (2013.01)

(58) Field of Classification Search
CPC .......................... H05K 1/0204; H05K 1/0206
See application file for complete search history.

(56) References Cited

U.S. PATENT DOCUMENTS

| | | | |
|---|---|---|---|
| 5,857,767 | A | 1/1999 | Hochstein |
| 6,299,337 | B1 | 10/2001 | Bachl et al. |

(Continued)

FOREIGN PATENT DOCUMENTS

| | | |
|---|---|---|
| WO | 2004107443 A1 | 12/2004 |
| WO | 2006/043234 A1 | 4/2006 |

OTHER PUBLICATIONS

International Search Report and Written Opinion, dated Dec. 9, 2015 in corresponding PCT Appln. No. PCT/US2015/052865.

*Primary Examiner* — Evan Dzierzynski
(74) *Attorney, Agent, or Firm* — Fitzpatrick, Cella, Harper & Scinto

(57) ABSTRACT

A flexible circuit board includes an electrically insulating top sheet and an electrically insulating bottom sheet. A plurality of conductive traces is positioned between the electrically insulating top and bottom sheets. A first conductive trace has a first contact pad, and a second conductive trace has a second contact pad. The first and second contact pads are exposed through at least one opening in the electrically insulating top sheet, and each of the first and second contact pads are configured to be connected to an LED. A third contact pad is exposed through openings in the electrically insulating top and bottom sheets, with a top surface of the third contact pad configured to be connected to the LED and a bottom surface of the third contact pad configured to be connected to a heat diffusion device.

14 Claims, 4 Drawing Sheets

(51) Int. Cl.
*F21Y 105/10* (2016.01)
*F21Y 115/10* (2016.01)

(56) References Cited

U.S. PATENT DOCUMENTS

| | | | |
|---|---|---|---|
| 6,498,355 | B1 | 12/2002 | Harrah et al. |
| 8,236,619 | B2 * | 8/2012 | Lin ................... H01L 21/486 |
| | | | 438/118 |
| 8,476,645 | B2 | 7/2013 | McDaniel et al. |
| 8,525,193 | B2 | 9/2013 | Crandell et al. |
| 8,641,229 | B2 | 2/2014 | Li |
| 2005/0161682 | A1 * | 7/2005 | Mazzochette ....... H01L 25/0753 |
| | | | 257/79 |
| 2007/0025108 | A1 | 2/2007 | Kingsford et al. |
| 2011/0204408 | A1 | 8/2011 | McKenzie et al. |
| 2013/0021811 | A1 | 1/2013 | Goldwater |
| 2013/0039013 | A1 | 2/2013 | Waegli et al. |
| 2013/0233607 | A1 | 9/2013 | Nakamura et al. |
| 2014/0264427 | A1 | 9/2014 | Tischler |
| 2014/0268780 | A1 | 9/2014 | Wang et al. |

* cited by examiner

LIGHT EMITTING DIODE (LED) ASSEMBLY AND FLEXIBLE CIRCUIT BOARD WITH IMPROVED THERMAL CONDUCTIVITY

CROSS-REFERENCE TO RELATED APPLICATION

This application claims the benefit under 35 U.S.C. §119 (e) of U.S. Provisional Patent Application No. 62/057,426, filed Sep. 30, 2014, and titled "LED assembly with minimal thermal resistance." The foregoing application is hereby incorporated by reference in its entirety and is made a part of this specification for all that it discloses.

FIELD OF THE INVENTION

This invention relates to a flexible circuit board and, in particular, a flexible circuit board for a light emitting diode (LED) assembly.

BACKGROUND OF THE INVENTION

Light emitting diodes (LEDs) are a popular lighting solution for many applications. LEDs have a number of benefits including longer life and lower energy usage than traditional lighting solutions such as incandescent lights. In general, one or more LEDs are attached to a circuit board. Typical circuit boards include electrically conductive traces sandwiched between two electrically insulating surfaces. The electrically insulating surfaces may be made from a glass-reinforced epoxy such as FR4 or an insulated metal substrate (IMS). Another type of circuit board used for LED arrays is a flexible circuit board. Here, the traces are sandwiched between flexible insulating surfaces such as polyimide.

One technical challenge associated with LED lighting arrays is the dissipation of heat generated by the LED. Unlike other light sources, visible-spectrum LEDs only dissipate a small portion of their heat by radiation. Heat degrades LED performance and reliability. For example, a higher junction temperature results in lower light output from the LED and shorter lifetime. There is thus a need for a circuit board with good thermal management to increase lumens output without overheating, resulting in higher performance lighting products.

SUMMARY OF THE INVENTION

The present invention relates to a flexible circuit board. The flexible circuit board is especially suited for attaching LEDs.

In one aspect, the invention relates to a flexible circuit board including an electrically insulating top sheet and an electrically insulating bottom sheet. A plurality of conductive traces is positioned between the electrically insulating top and bottom sheets. A first conductive trace has a first contact pad, and a second conductive trace has a second contact pad. The first and second contact pad are exposed through at least one opening in the electrically insulating top sheet, and each of the first and second contact pads are configured to be connected to an LED. A third contact pad is exposed through openings in the electrically insulating top and bottom sheets, with a top surface of the third contact pad configured to be connected to the LED and a bottom surface of the third contact pad configured to be in contact with a heat diffusion device.

In another aspect, the invention relates to a light emitting diode assembly including a flexible circuit board and an LED. The flexible circuit board includes an electrically insulating top sheet and an electrically insulating bottom sheet. A plurality of conductive traces is positioned between the electrically insulating top and bottom sheets. A first conductive trace has a first contact pad, and a second conductive trace has a second contact pad. The flexible circuit board also includes a third contact pad. A bottom surface of the third contact pad is exposed through an opening in the electrically insulating bottom sheet. The light emitting diode includes a first electrical connection, a second electrical connection, and a heat conduction connection. The first electrical connection is connected to the first contact pad by a joining material through an opening in the electrically insulating top sheet. The second electrical connection is connected to the second contact pad by the joining material through an opening in the electrically insulating top sheet. The heat conduction connection is connected to the third contact pad by the joining material through an opening in the electrically insulating top sheet.

In yet another aspect, the invention relates to a light emitting diode assembly including a flexible circuit board, a light emitting diode, a heat sink, and a thermal interface material. The flexible circuit board includes an electrically insulating top sheet and an electrically insulating bottom sheet. A plurality of conductive traces is positioned between the electrically insulating top and bottom sheets. A first conductive trace has a first contact pad, and a second conductive trace has a second contact pad. The flexible circuit board also includes a third contact pad. The light emitting diode includes a first electrical lead, a second electrical lead, and a heat conduction lead. The first electrical lead is soldered to the first contact pad through an opening in the electrically insulating top sheet. The second electrical lead is soldered to the second contact pad through an opening in the electrically insulating top sheet. The heat conduction lead is soldered to the third contact pad through an opening in the electrically insulating top sheet. The heat sink is disposed adjacent to the electrically insulating bottom sheet and a bottom surface of the third contact pad. The thermal interface material is disposed between the bottom surface of the third contact pad and a top surface of the heat sink.

DETAILED DESCRIPTION OF THE PREFERRED EMBODIMENTS

Figure 1:
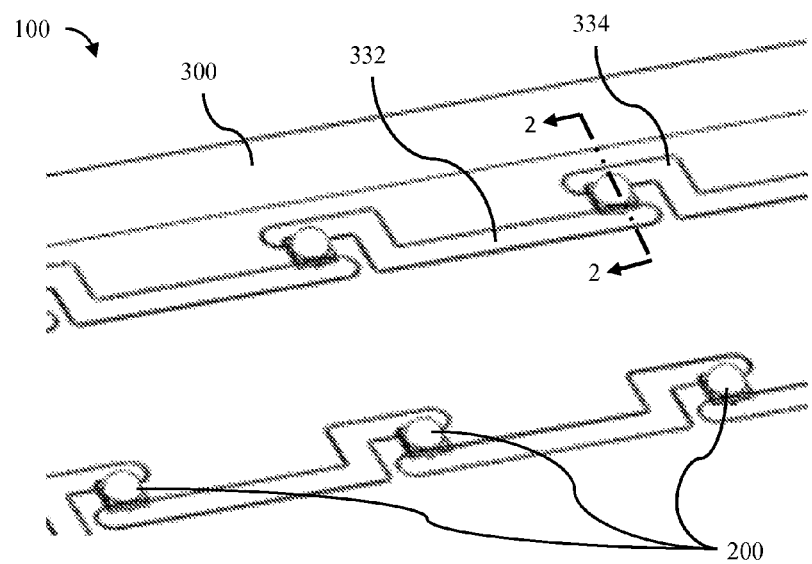
FIG. 1 shows a portion of an LED assembly according to a preferred embodiment of the invention.

Exemplary preferred embodiments of the invention will now be described with reference to the accompanying figures. Like reference numerals refer to the same or similar elements throughout the figures and description.

FIG. 1 shows a portion of an LED assembly 100 according to a preferred embodiment of the invention. In this embodiment, a plurality of LEDs 200 is mounted on a flexible circuit board 300 to form an array of LEDs. Those skilled in the art will recognize that any suitable LED array may be used without deviating from the scope of the invention, and even a single LED 200 may be used. Any suitable LED may be used with this invention, including for example, a surface mountable InGaN LED made by Cree, Inc. The LEDs are connected to one another by conductive traces 332, 334 in the flexible circuit board 300.

Figure 2:
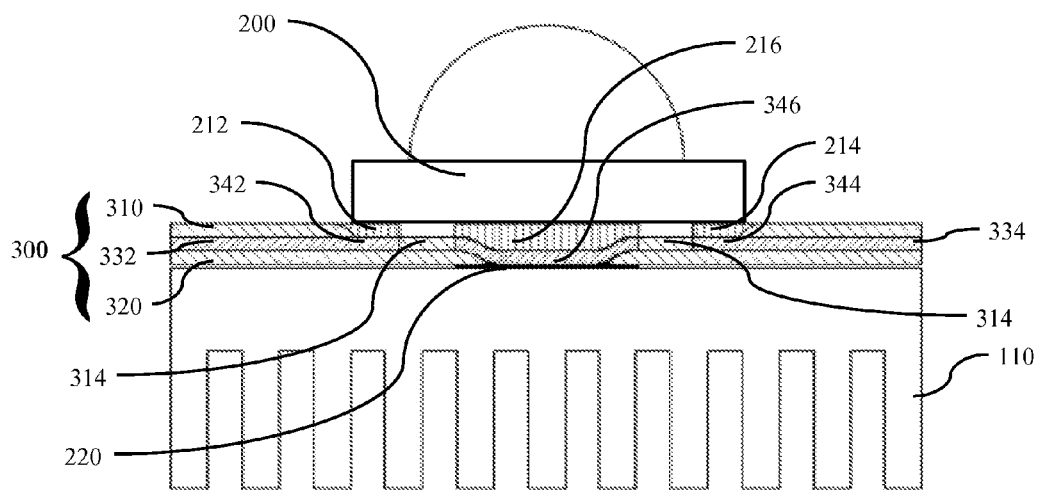
FIG. 2 is a cross-section view of a portion of the LED assembly in FIG. 1 taken along line 2-2.

FIG. 2 shows a cross-sectional view of the LED assembly 100. As will be discussed further below, the LED 200 is mounted to the flexible circuit board 300, and the flexible circuit board 300 is mounted to a heat dissipation device 110 such as, for example, a heat sink, a chassis, or a cold plate.

Figure 3:
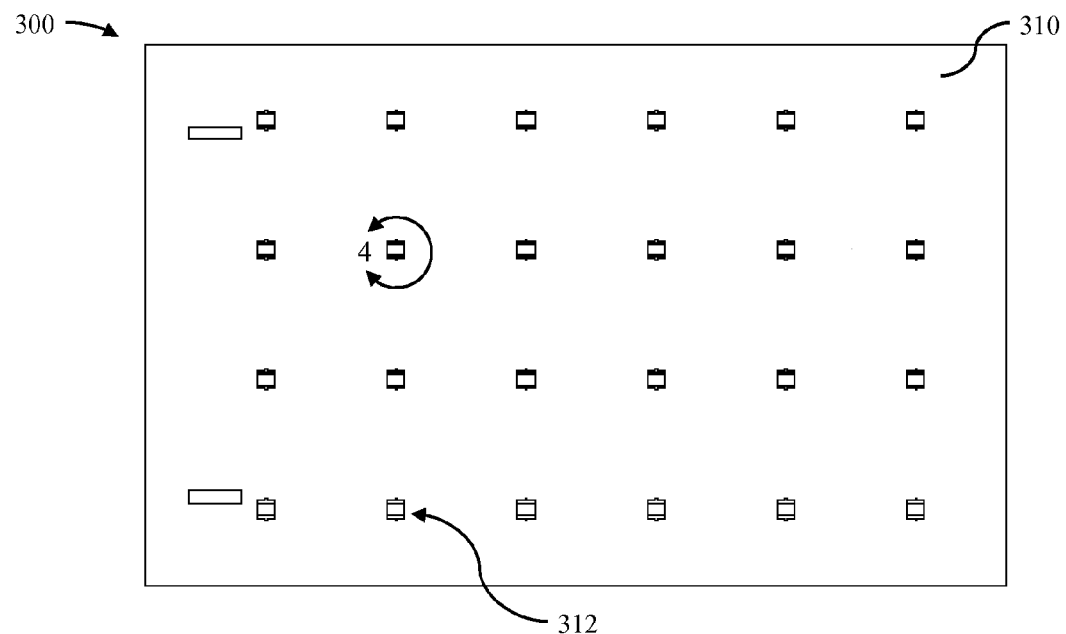
FIG. 3 shows a top view of a flexible circuit board according to a preferred embodiment of the invention.
Figure 4:
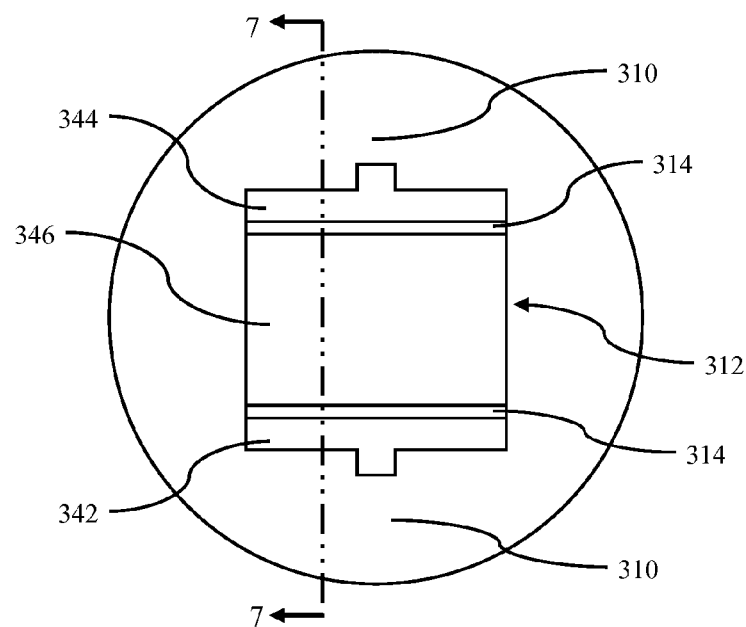
FIG. 4 is a detail view showing detail 4 of the flexible circuit board shown in FIG. 3.
Figure 5:
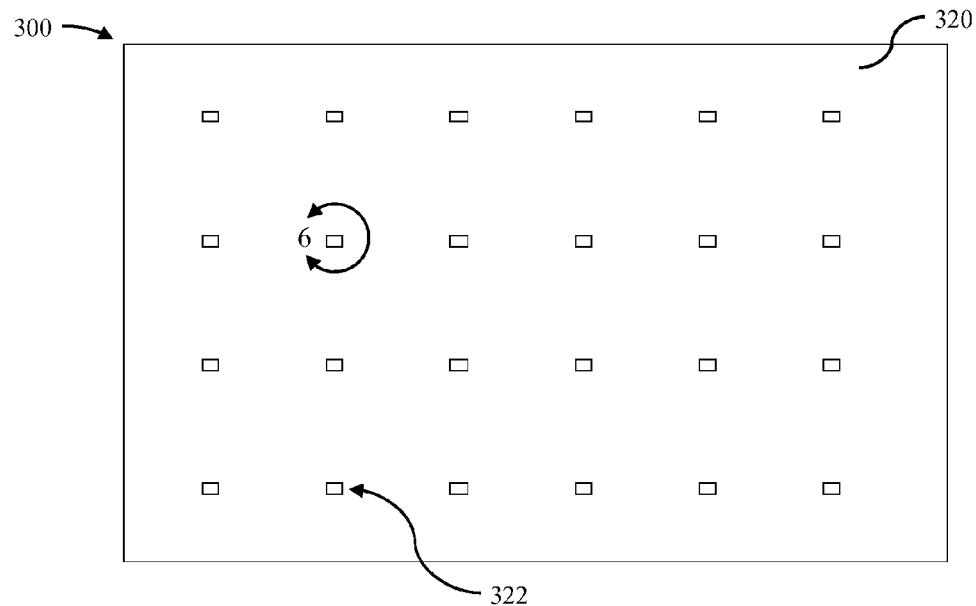
FIG. 5 shows a bottom view of the flexible circuit board shown in FIG. 3.
Figure 6:
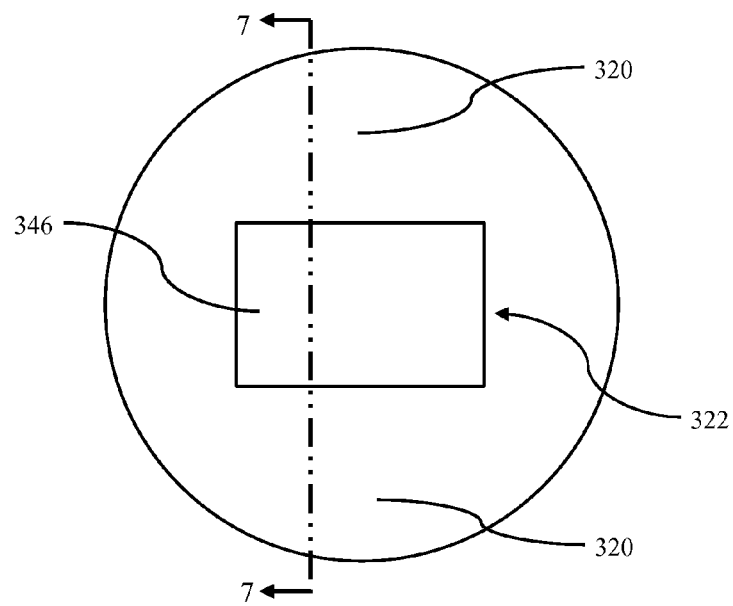
FIG. 6 is a detail view showing detail 6 of the flexible circuit board shown in FIG. 5.
Figure 7:
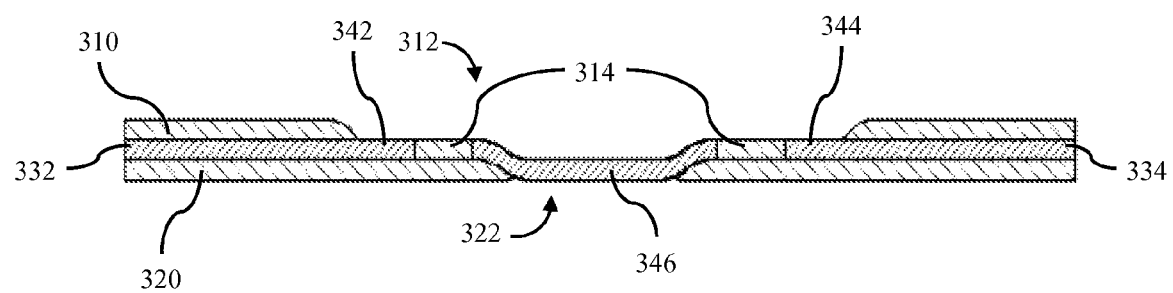
FIG. 7 is a cross-section view of a portion of the flexible circuit board in FIGS. 4 and 6 taken along line 7-7.

FIGS. 3-7 show a preferred embodiment of the flexible circuit board 300. FIG. 3 is a top view of the flexible circuit board 300. Several openings are made in a top layer or sheet 310 of the flexible circuit board 300 to expose contact pads 342, 344, 346, on which LEDs 200 are mounted. The opening 312 in the top sheet 310 is shown in detail in FIG. 4 (detail 4 from FIG. 3). FIG. 6 is a bottom view of the flexible circuit board 300. Several openings 322 are made in the bottom layer or sheet 320 to expose a bottom surface of the third contact pad 346 and facilitate heat removal, as will be discussed further below. The opening 322 in the bottom sheet 320 is shown in detail in FIG. 6 (detail 6 from FIG. 5). FIG. 7 shows a cross-section of the flexible circuit board 300 taken along line 7-7 in FIGS. 4 and 6.

Conductive traces 332, 334 are sandwiched between two electrically insulating sheets: an electrically insulating top sheet 310 and an electrically insulating bottom sheet 320. Any suitable electrically insulating material may be used for these sheets. In this embodiment, the electrically insulating top and bottom sheets 310, 320 are thin sheets of a flexible, electrically insulating material such as a polyimide. An example of a suitable polyimide is Kapton® made by DuPont™.

An opening 312 is made in the electrically insulating top sheet to expose the first contact pad 342 and the second contact pad 344. In this embodiment, the first and second contact pads 342, 344 are ends of a first trace 332 and a second trace 334, respectively, and are used to provide electrical connection to the LED 200. The first and second contact pads 342, 344 and traces 332, 334 may be made from any suitable electrically conductive material, for example, copper. As shown in FIG. 2, the first contact pad 342 is connected to an electrical connection on one side of the LED 200, and the second contact pad 344 is connected to another electrical connection on the other side of the LED 200. The LED 200 may have contact pads or leads (not shown) on each side for electrical connection to the first and second contact pads 342, 344.

In this embodiment, the first and second contact pads 342, 344 are connected to the LED 200 by a joining material, which forms first and second joining layers 212, 214, through the opening 312 in the electrically insulating top layer 310. Any suitable joining method and corresponding material may be used to connect the LED 200 to the first and second contact pads 342, 344. The LED 200 may be connected to the first and second contact pads 342, 344 by, for example, soldering with any suitable solder such as tin-lead alloys or led-free solders such as tin-silver alloys. The LED 200 may also be connected to the first and second contact pads 342, 344 by, for example, use of an electrically conductive epoxy or by silver sintering.

Turning back to FIG. 5, the flexible circuit board 300 also includes a third contact pad 346. In this embodiment, the third contact pad 346 is positioned between the first and second contact pads 342, 344 and electrically isolated from the first and second contact pads 342, 344 by strips 314. Strips 314 may be made of the same material as the electrically insulating top sheet 310. The third contact pad 346 is designed for efficient heat conduction away from the LED 200. In particular, a bottom surface of the third contact pad 346 is exposed through an opening 322 in the electrically insulating bottom layer 320. Any suitable material for heat conduction may be used for the third conduction pad 346, including for example, copper.

As shown in FIG. 2, the third contact pad 346 is connected to a center portion of the LED 200 for heat conduction. In this embodiment, the third contact pad 346 is connected to the LED 200 by a joining material, which forms a third joining layer 216, through the opening 312 in the electrically insulating top layer 310. The third contact pad 346 may be joined to a thermal connection, such as a contact pad, on the bottom of the LED 200 by any suitable method including soldering, sintering, or the application of epoxy as discussed above with respect to connecting the first and second contact pads 342, 344 to the LED 200.

Also as shown in FIG. 2, the flexible circuit board is attached to a heat dissipation device 110. The flexible circuit board 300 may be attached to the heat dissipation device using any suitable means including compression as a result of mechanical fastening or adhesive applied on the bottom surface the electrically insulating bottom sheet 320. Preferably, the third contact pad 346 is designed so that the bottom surface of the contact pad 346 is substantially co-planar with the bottom surface of the electrically insulating bottom layer 320. In other words, a central portion of the third contact pad 346 sits down in the opening 322 in the electrically insulating bottom sheet 320, leaving its top surface horizontally below the first and second contact pads 342, 344. With this preferred construction, good connection with minimal gaps at the interface between the third contact pad 346 and the heat dissipation device 110 may be achieved to promote heat conduction across the interface. To further promote heat conduction, a thermal interface material 220 such as thermal grease or phase change materials may be used.

With this arrangement, the flexible circuit board is able to efficiently remove heat by conduction from the LED 200. Heat is conducted by two thin layers, the third joining layer 216 and the third contact pad 346. Each of these layers is preferably from about ½ mil to about 3 mils thick. When a thermal interface material 220 is used, the thickness of the thermal interface material 220 is preferably from about ½ mil to about 3 mils thick. Thus, heat is conducted a total of about 1 mil to about 9 mils from the LED 200 to the heat dissipation device 110. Accordingly, the LED can be driven at a high power level to achieve high lumen outputs while the junction temperature is kept low.

The embodiments discussed herein are examples of preferred embodiments of the present invention and are provided for illustrative purposes only. They are not intended to limit the scope of the invention. Although specific configurations, structures, materials, etc. have been shown and described, such are not limiting. Modifications and variations are contemplated within the scope of the invention, which is to be limited only by the scope of the accompanying claims.

What is claimed is:

1. A flexible circuit board comprising:
   an electrically insulating top sheet;
   an electrically insulating bottom sheet having a bottom surface at least a portion of which lies in a first plane;
   a plurality of conductive traces positioned between the electrically insulating top and bottom sheets, a first conductive trace having a first contact pad with a bottom surface lying in a second plane, a second conductive trace having a second contact pad with a bottom surface lying in the second plane, the first and second contact pad being exposed through at least one opening in the electrically insulating top sheet and each of the first and second contact pads configured to be connected to an LED; and
   a third contact pad being exposed through openings in the electrically insulating top and bottom sheets, with a top surface of the third contact pad configured to be connected to the LED and a bottom surface of the third contact pad configured to be connected to a heat diffusion device, the bottom surface of the third contact pad lying in multiple planes with at least a portion of the bottom surface of the third contact pad lying in a third plane, the third plane being closer to the first plane than the second plane.

2. The flexible circuit board of claim 1, wherein the electrically insulating top sheet and the electrically insulating bottom sheet are both flexible films.

3. The flexible circuit board of claim 1, wherein at least one of the flexible films is a polyimide film.

4. The flexible circuit board of claim 1, wherein each of the first, second, and third contact pads comprise at least copper.

5. The flexible circuit board of claim 1, wherein the first and third planes are substantially co-planar.

6. The flexible circuit board of claim 1, wherein the third contact pad has a first lateral side and a second lateral side, with the bottom surface of the third contact pad disposed between the first and second lateral sides and lying in the first plane.

7. A light emitting diode assembly comprising:
   a flexible circuit board including:
      an electrically insulating top sheet;
      an electrically insulating bottom sheet;
      a plurality of conductive traces positioned between the electrically insulating top and bottom sheets, with a first conductive trace having a first contact pad and a second conductive trace having a second contact pad; and
      a third contact pad with a bottom surface of the third contact pad being exposed through an opening in the electrically insulating bottom sheet, with lateral portions of the third contact pad being substantially co-planer with the first and second contact pads, and a central portion of the third contact pad being substantially co-planer with the bottom sheet; and
   a light emitting diode including:
      a first electrical connection connected to the first contact pad by a joining material through an opening in the electrically insulating top sheet;
      a second electrical connection connected to the second contact pad by the joining material through an opening in the electrically insulating top sheet; and
      a heat conduction connection connected to the third contact pad by the joining material through an opening in the electrically insulating top sheet.

8. The light emitting diode assembly of claim 7, wherein the joining material is solder or electrically conductive epoxy.

9. The light emitting diode assembly of claim 7, wherein a total thickness of the third contact pad and the joining material is from about 1 mil to about 6 mils.

10. The light emitting diode assembly of claim 7, further comprising a heat diffusion device attached to the electrically insulating bottom sheet.

11. The light emitting diode assembly of claim 10, further comprising a thermal interface material between a bottom surface of the third contact pad and a top surface of the heat diffusion device.

12. A light emitting diode assembly comprising:
    a flexible circuit board including:
       an electrically insulating top sheet having an opening;
       an electrically insulating bottom sheet having an opening; and
       a plurality of conductive traces positioned between the electrically insulating top and bottom sheets, with a first conductive trace having a first contact pad and a second conductive trace having a second contact pad; and
       a third contact pad disposed in the opening of the electrically insulating bottom sheet, with the third contact pad being shaped to occupy a first horizontal plane with the first and second contact pads and a second horizontal plane with the bottom sheet; and
    a light emitting diode including:
       a first electrical lead soldered to the first contact pad through the opening in the electrically insulating top sheet;
       a second electrical lead soldered to the second contact pad through the opening in the electrically insulating top sheet; and
       a heat conduction lead soldered to the third contact pad through the opening in the electrically insulating top sheet;
    a heat sink disposed adjacent to the electrically insulating bottom sheet and a bottom surface of the third contact pad; and
    a thermal interface material disposed between the bottom surface of the third contact pad and a top surface of the heat sink.

13. The flexible circuit board of claim 12, wherein the third contact pad has a first lateral side and a second lateral side disposed in the first horizontal plane.

14. The flexible circuit board of claim 13, wherein the third contact pad has a central portion disposed in the second horizontal plane.

* * * * *

UNITED STATES PATENT AND TRADEMARK OFFICE
CERTIFICATE OF CORRECTION

PATENT NO. : 9,648,750 B2
APPLICATION NO. : 14/510299
DATED : May 9, 2017
INVENTOR(S) : Ching Au and Keith E. Monaghan Page 1 of 1

It is certified that error appears in the above-identified patent and that said Letters Patent is hereby corrected as shown below:

On the Title Page

At Item (12), "Au" should read --Au et al.--

At Item (72), Inventor: "Ching Au, Port Washington, NY (US)" should read --Ching Au, Port Washington, NY (US); Keith E. Monaghan, Port Jefferson, NY (US)--

Signed and Sealed this
Seventeenth Day of October, 2017

Joseph Matal
*Performing the Functions and Duties of the*
*Under Secretary of Commerce for Intellectual Property and*
*Director of the United States Patent and Trademark Office*